(12) United States Patent
Uraoka et al.

(10) Patent No.: US 7,901,978 B2
(45) Date of Patent: Mar. 8, 2011

(54) METHOD OF FABRICATING THIN-FILM TRANSISTOR

(75) Inventors: Yukiharu Uraoka, Ikoma (JP); Takashi Fuyuki, Ikoma (JP); Hiroya Kirimura, Ikoma (JP)

(73) Assignee: National University Corporation Nara Institute of Science and Technology, Ikoma-shi (JP)

( * ) Notice: Subject to any disclaimer, the term of this patent is extended or adjusted under 35 U.S.C. 154(b) by 442 days.

(21) Appl. No.: 11/918,245

(22) PCT Filed: Mar. 28, 2006

(86) PCT No.: PCT/JP2006/306307
§ 371 (c)(1),
(2), (4) Date: Oct. 11, 2007

(87) PCT Pub. No.: WO2006/109565
PCT Pub. Date: Oct. 19, 2006

(65) Prior Publication Data
US 2009/0050880 A1 Feb. 26, 2009

(30) Foreign Application Priority Data
Apr. 11, 2005 (JP) ................. 2005-113361

(51) Int. Cl.
*H01L 51/40* (2006.01)
(52) U.S. Cl. ............................. 438/99; 257/40
(58) Field of Classification Search .............. 257/40; 438/99
See application file for complete search history.

(56) References Cited

U.S. PATENT DOCUMENTS

| 6,303,516 B1 * | 10/2001 | Morita et al. ............. 438/758 |
| 7,041,530 B2 * | 5/2006 | Nunoshita et al. ........ 438/99 |
| 2007/0181945 A1 * | 8/2007 | Nakamura ................. 257/347 |

FOREIGN PATENT DOCUMENTS

| JP | A-08-148426 | 6/1996 |
| JP | A-H11-087242 | 3/1999 |
| JP | A-2005-200425 | 7/2005 |
| WO | WO 2004/033366 | 4/2004 |

OTHER PUBLICATIONS

International Search Report for corresponding International application No. PCT/JP2006/306307 mailed on May 30, 2006.
International Preliminary Report on Patentability and Written Opinion of the International Searching Authority for corresponding International application No. PCT/JP2006/306307 mailed Oct. 16, 2007.

* cited by examiner

*Primary Examiner* — Kenneth A Parker
*Assistant Examiner* — Anthony Ho
(74) *Attorney, Agent, or Firm* — Posz Law Group, PLC

(57) ABSTRACT

The core metal of a protein such as ferritin is used as a nucleus for crystallizing a silicone thin film and then the thus crystallized film is employed in the channel part of a thin-film transistor. By aligning the protein on the surface of amorphous silicone and heating, the crystallinity is controlled. In the case of ferritin, the core diameter of the protein is 7 mm. That is, this protein is highly even in size (i.e., the metal content). Thus, the amount of the protein to be deposited on the amorphous silicone surface can be accurately controlled by controlling the protein core density. Furthermore, the type of the core metal can be altered by chemical reactions and the above method is applicable not only to amorphous silicone but also to amorphous films of various types such as germanium. Thus, the amount of nickel required in crystallization is controlled by using a protein. Moreover, the distribution density of the nickel core is controlled to thereby conduct crystallization at a desired crystal size.

5 Claims, 6 Drawing Sheets (a)

(b)

TEM image of nickel-encapsulating ferritin (a) Ni core density: $2.5 \times 10^{11} cm^{-2}$    (b) Ni core density: $2.8 \times 10^{10} cm^{-2}$    (c) Ni core density: $2.6 \times 10^{9} cm^{-2}$ Cores of nickel silicide before UV ozonation (a') Ni core density: $2.5 \times 10^{11} cm^{-2}$    (b') Ni core density: $2.8 \times 10^{10} cm^{-2}$    (c') Ni core density: $2.6 \times 10^{9} cm^{-2}$ Cores of nickel silicide after UV ozonation

METHOD OF FABRICATING THIN-FILM TRANSISTOR

FIELD OF THE INVENTION

The present invention relates to a method of fabricating a thin-film transistor, and specifically, to a technique for forming a polysilicon thin film having cores of protein such as ferritin as crystal cores.

BACKGROUND OF THE INVENTION

With liquid crystal displays (LCD) having rapidly spread in products such as TVs, cell phones, etc., as a result of an increase in screen size and higher functions, a higher performance display is demanded. In addition, simplification of the fabrication process by incorporating a large-scale integration (LSI) driver circuit, etc., around an LCD into the LCD has been demanded.

To meet these demands, the key to improving the LCD is the performance of thin-film transistors (TFT). In addition, thin-film transistors (TFT) are expected to serve as a technique for realizing system-on-panel or the like. The TFT has a function, etc., as a switch for charging various pixels of the LCD in response to a driver circuit, and at present, in many cases, the TFT is formed of an amorphous film such as amorphous silicon set on a transparent substrate such as a glass substrate.

However, the TFT formed of an amorphous film is low in electron mobility and hardly meets the demand for higher performance, so that various attempts have been made to try to improve the amorphous film.

Therefore, for a channel layer of the TFT, a silicon film with high quality has been demanded.

One of the more typical trial improvements is substitution of the amorphous silicon with polysilicon. Due to polycrystallization of silicon, the electron mobility is increased from 0.1 to 0.2 $cm^2/Vs$ to 10 to 500 $cm^2/Vs$. In this case, the larger the crystal grains, the fewer the barriers of the crystal grain boundary are in the path of electrons, so that it is desirable to acquire crystal grains as large as possible. The electron mobility of polysilicon with a large grain size (several micrometers) is equivalent to that of single crystal (500 to 700 $cm^2/Vs$).

As a typical method of crystallizing amorphous silicon, there is a method using annealing according to a solid-phase crystallization method. This is a method in which random silicon bonds are once cut and silicon atoms are rearranged. In this method, generally, amorphous silicon must be heated to about 600 degrees C., and this deteriorates the material, and it becomes difficult to use an inexpensive glass substrate.

Therefore, a method of crystallizing amorphous silicon at a low temperature (not more than 550 degrees C.) has been demanded, and this has been variously researched. For using a glass substrate, crystallization at a low temperature is desirable.

In various studies, it is thought that the use of metal, etc., as a core of crystallization shows promise in promoting crystallization at a low temperature. Particularly, nickel silicide ($NiSi_2$) has a lattice constant close to that of silicon, and has less distortion in use, so that it is considered as most promising.

As a study on the use of nickel, a metal imprint method is conventionally known. In the metal imprint method, a tip-array coated with a nickel thin film is pressure-bonded to an amorphous silicon film and silicon is crystallized by means of solid-phase growth by using a minute amount of metal mark at a position where the tip came into contact with as a crystal core, and the amount of nickel to be transferred changes depending on the method of applying a force, so that the amount cannot be strictly controlled.

As another technique using nickel, a method in which a film of nickel or the like is overlaid on an amorphous silicon film by means of sputtering or electron beam deposition and a method in which nickel or the like is introduced by means of electroless plating, selective chemical deposition, or ion implantation have been proposed (for example, refer to Patent document 1). However, none of these supply only the necessary amount of nickel by properly controlling the additional amount of nickel, but remove an excess supply later.

[Patent document 1] Japanese Unexamined Patent Publication No. H11-87242

DISCLOSURE OF THE INVENTION

Problem to be Solved by the Invention

As described above, when a metal such as nickel is used to promote crystallization of an amorphous film of amorphous silicon, etc., for fabricating a high-performance TFT with high electron mobility, a technique for properly controlling the amount of nickel, etc., to be used so that only the necessary amount is supplied has not yet been developed.

An object of the present invention is to acquire a desired crystal grain size required in crystallization by adjusting the distribution density of nickel cores by controlling the nickel amount necessary for crystallization by using protein by employing biotechnology.

Means for Solving the Problem

The present inventors found the following (a) through (d) while advancing their research.

(a) When a metal such as nickel is deposited on amorphous silicon and subjected to heat treatment, nickel and silicon react with each other and produce silicide, and crystal growth occurs by using silicide as cores.

(b) On the other hand, metal cores are encapsulated in protein such as ferritin.

(c) Generally, iron oxide is encapsulated in ferritin in the national world, and this can be substituted by a metal such as Ni or Co by means of chemical reaction.

(d) Protein has a self-organizing capability, and its density is controllable.

The present inventors focused on (a) through (d) described above, conceived application of such biotechnology for fabrication of a thin-film transistor, and completed the present invention.

According to a first aspect of the present invention, a thin-film transistor using a film crystallized by using supramolecular cores of protein as crystal cores for a channel portion is provided.

By arranging supramolecular cores of protein on the surface of amorphous silicon and applying heat treatment, crystallinity can be controlled, so that by using a film crystallized by using supramolecular cores of protein as crystal cores for the channel portion, a thin-film transistor with high quality is provided.

According to a second aspect of the present invention, a thin-film transistor using ferritin as the protein of the above first aspect is provided. The diameter of ferritin is 7 nanometers, and its size, that is, its metal amount is uniform so that the amount of metal to be deposited on the surface of amorphous silicon can be more accurately controlled by controlling the density of protein cores.

According to a third aspect of the present invention, a thin-film transistor in which supramolecular cores of protein are substituted by a metal other than the metal encapsulated in the supramolecular cores by means of chemical reaction is provided. The kind of metal of the supramolecular cores of protein can be changed by chemical reaction, so that the cores can adapt to various kinds of amorphous films of not only amorphous silicon but also germanium, etc.

According to a fourth aspect of the present invention, a thin-film transistor in which the protein is protein in which nickel is encapsulated is provided. By using protein in which nickel is encapsulated, heat treatment causes nickel and silicon to react with each other and produces silicide, and crystal growth occurs by using silicide as cores.

According to a fifth aspect of the present invention, a method of fabricating a thin-film transistor is provided which is characterized by the steps of:

(1) depositing an amorphous film;
(2) arranging a metal encapsulated in protein on the amorphous film; and
(3) annealing the metal and the amorphous film, wherein a channel portion of the thin-film transistor is formed by crystallizing the amorphous film.

A metal such as nickel is set on an amorphous film, and by applying heat treatment, nickel and silicon react with each other to produce silicide, and crystals grow by using silicide as cores. In the present invention, a metal to be used for crystallizing amorphous is not transported singly and set on the amorphous film, but is encapsulated in protein and transported and set by transporting and setting the protein on the amorphous film.

That is, protein has a metal delivery function. Therefore, for setting a metal on the amorphous film, properties of protein can be utilized. Securing of an amount of metal corresponding to an encapsulating space and arrangement of the metal due to self-organizing capability are enabled by using protein.

According to a sixth aspect of the present invention, a method of fabricating a thin-film transistor in which a step of removing an outer protein shell is added after the step of arranging metal on the amorphous film is provided.

After appropriately arranging a metal by using the properties of the protein, the outer protein shell portion is removed to directly bring the effect of the metal to the amorphous silicon.

According to a seventh aspect of the present invention, a method of fabricating a thin-film transistor is provided in which the method of setting a metal on the amorphous film is a method of diluting protein in which a metal is encapsulated in a solution and dripping it on the amorphous film.

By diluting protein in a solution at an arbitrary ratio, protein with an arbitrary density can be set on the amorphous film.

According to an eighth aspect of the present invention, a method of fabricating a thin-film transistor in which the amorphous film is silicon is provided.

According to a ninth aspect of the present invention, a method of fabricating a thin-film transistor in which the protein is ferritin is provided.

Ferritin is known as a protein including iron oxide encapsulated in its cores, and the substance to be encapsulated in the cores can be changed by chemical reaction. According to the present invention, as protein that includes a metal of not only iron but also nickel or other metals encapsulated in cores, ferritin is used. The sizes of the encapsulation cores of ferritin are uniformly about 7 nanometers in diameter, and the amounts of metal to be encapsulated are also uniform, so that by controlling the density of cores of ferritin, the amount of metals can also be controlled.

According to a tenth aspect of the present invention, a method of fabricating a thin-film transistor in which the metal to be encapsulated in ferritin is nickel is provided. The lattice constant (0.5406 nanometers) of nickel silicide ($NiSi_2$) is very close to that of Si crystal (0.5430 nanometers), and lattice mismatch is not more than 0.4 percent, so that nickel is considered as most promising for crystallization of amorphous silicon.

According to an eleventh aspect of the present invention, a method of fabricating a thin-film transistor is provided in which an annealing temperature is 550 degrees C. or less. By promoting crystallization by a metal such as nickel, the crystallization temperature that was conventionally required to be about 600 degrees C. can be made lower.

According to a twelfth aspect of the present invention, a method of fabricating a thin-film transistor is provided in which by controlling the concentration of ferritin to be dripped on the amorphous film, the supply amount and the distribution density of nickel cores are controlled. By arranging ferritin diluted in a solution on an amorphous film at predetermined intervals, crystallization is promoted.

According to a thirteenth aspect of the present invention, a method of fabricating a thin-film transistor is provided in which the density of nickel cores is set to $10 \times 10^{10}$ cm$^{-2}$ or less by adjusting the concentration of ferritin. If the density of nickel cores is raised, it obstructs the lateral growth of crystals, so that the crystal growth is promoted by maintaining a constant density.

According to a fourteenth aspect of the present invention, a method of fabricating a thin-film transistor is provided in which in control of the distribution density of nickel cores, by patterning in advance a film for adsorbing ferritin at predetermined intervals or at positions corresponding to channel positions of the transistor on an amorphous film, ferritin is selectively arranged on the amorphous film.

In addition to the concentration adjustment of ferritin, the film for adsorbing ferritin is patterned on the amorphous film, whereby the distribution state of nickel cores can be further controlled.

EFFECTS OF THE INVENTION

The first aspect of the present invention brings about an effect that the crystallinity of a film forming a channel layer of a thin-film transistor can be controlled by arranging supramolecular cores of protein on the surface of amorphous silicon by using the self-organizing capability of the protein and performing crystallization by using the supramolecular cores as crystal cores. Thereby, an effect that a thin-film transistor with high quality can be obtained is brought about. It was found that, when a film fabricated according to the present invention was analyzed, the impurity concentration was one digit or more smaller than that of a film fabricated according to a conventional method. This greatly influences the OFF characteristic of the thin-film transistor. In addition, the crystallization position can be controlled, so that a thin-film transistor with excellent performance can be obtained by fabricating the thin-film transistor at a specific location.

According to the second aspect of the present invention, ferritin includes iron oxide encapsulated in cores, so that an effect by arranging the cores on amorphous silicon and applying heat treatment thereto, crystal silicon grows by using the cores as crystal cores, and a polysilicon thin film can be obtained. The diameters of the cores of ferritin are uniformly 7 nanometers, and its size, that is, its metal amount is effectively controllable.

The third aspect of the present invention brings about an effect that the kind of metal in the cores can be changed by chemical reaction, so that the cores can adapt to various amorphous films of not only amorphous silicon but also germanium, etc.

The fourth aspect of the present invention brings about an effect that nickel and silicon react with each other by means of heat treatment and produce silicide, and crystals can grow by using silicide as cores.

According to the fifth aspect of the present invention, a metal is encapsulated in protein and set on an amorphous film, so that the metal to be encapsulated can be controlled by controlling protein. Adjustment of the amount of protein is comparatively easy, and an arrangement function based on the self-organizing capability of the protein can be effectively utilized.

The metal to be encapsulated in protein can be controlled, and this brings about an effect that harmful influences from a metal remaining amount can be prevented, and the transistor performance can be improved.

According to the sixth aspect of the present invention, an outer protein shell portion is removed after being set on the amorphous film. Because the outer protein shell portion is an impurity and obstructs the crystal growth, the portions are removed. By removing the outer protein shell, the crystal growth is promoted.

According to a seventh aspect of the present invention, by diluting protein and dripping it onto an amorphous film, protein with a desired concentration can be set on the amorphous film. Therefore, the intervals between metals encapsulated in the protein are maintained to be equal to the intervals of the protein. That is, by controlling the intervals of the protein, spaces around the metal necessary for lateral crystal growth can be secured.

According to the eighth aspect of the present invention, by enabling crystallization of amorphous silicon that is the most generally used as a material for a thin-film transistor at present, the effect of the present invention can be widely provided.

According to the ninth aspect of the present invention, by using ferritin as the protein, various metals can be encapsulated therein. Ferritin normally includes iron encapsulated therein, however, by applying a chemical reaction, nickel and cobalt, etc., can be encapsulated in ferritin from which iron cores are removed. Therefore, this can be made compatible with various amorphous films without limiting the amorphous silicon.

According to the tenth aspect of the present invention, by selecting nickel as a metal to be encapsulated in protein, crystallization can be more effectively realized. Nickel silicide has a lattice constant very close to that of silicon, and has a smaller distortion. In addition, the remaining nickel serves as a carrier and has a harmful effect that causes a current to flow from source to drain even in an OFF state of the TFT. In the crystallization method according to the present invention, the nickel amount can be controlled, so that the problem of remaining nickel can be prevented.

According to the eleventh aspect of the present invention, heat treatment can be applied at a temperature lower than the conventional annealing temperature, and harmful influences on the glass substrate can be reduced. The formation temperature of nickel disilicide (NiSi2) on amorphous silicon is 400 degrees C., so that the annealing temperature of the present invention can be lowered up to 400 degrees C.

According to the twelfth aspect of the present invention, by adjusting the concentration of ferritin, a desired distribution density of nickel cores can be obtained. By obtaining the desired distribution density, a desired crystal grain size can be obtained, and a crystal grain size of 5 to 10 micrometers that is a channel length of the TFT can be realized.

According to the thirteenth aspect of the present invention, by setting the density of nickel cores to $2.6 \times 10^9$ $cm^{-2}$, a predetermined or more crystal grain size can be secured.

According to the fourteenth aspect of the present invention, by patterning in advance a film for adsorbing ferritin at predetermined intervals on an amorphous film, a desired distribution state of nickel cores can be realized on the amorphous film. Therefore, the problem of remaining nickel can be solved and nickel resources can be effectively utilized.

BEST MODE FOR CARRYING OUT THE INVENTION

A thin film transistor is fabricated by using protein containing metal in cores such as ferritin as cores of crystallization of a silicon thin film. In ferritin existing in the national world, iron oxide with a diameter of 7 nanometers is encapsulated in cores. By arranging the cores on amorphous silicon and applying heat treatment thereto, crystal silicon is grown by using the cores as crystal cores, a polysilicon thin film is obtained. This film is used for the channel layer of a thin-film transistor.

By arranging protein on the surface of amorphous silicon and applying heat treatment thereto, crystallinity can be controlled. The diameter of cores of ferritin is 7 nanometers, and their sizes, that is, metal amounts are very uniform. Therefore, by controlling the density of cores of protein, the amount of deposition on the surface of amorphous silicon can be accurately controlled.

The kind of metal in the cores can be changed by chemical reaction. Therefore, it can be made compatible with various amorphous films of not only amorphous silicon but also germanium, etc.

Hereinafter, an embodiment of the present invention will be described in detail with reference to the drawings.

Example 1

FIG. 1(*a*) is a sectional view of Ni core-encapsulating ferritin. Ferritin is supramolecules with a spherical shell structure in which 24 subunits each formed of one polypeptide chain gather by noncovalent bonding, and has a vacancy inside a molecular weight of about 460,000.

FIG. 1(*b*) is a schematic view of an injection of nickel ions into a cavity of apoferritin (ferritin without a core) The process of introducing Ni into the apoferritin cavity is shown. Apoferritin has an outer protein shell and a cavity with a diameter of 7 nanometers, and channels formed in the outer shell.

(Method of Producing Ni-Encapsulating Ferritin)

A method of producing Ni-encapsulating ferritin from apoferritin will be described. Apoferritin that had no core was placed into an ammonium nickel sulfate solution containing nickel ions, and was adjusted in pH (HEPES effective pH range: 6.8 to 8.2, CAPSO effective pH range: 9.3 to 10.7) by using a buffer solution (a mixed solution of a Good's buffer solution HEPES and CAPSO) along with bubbling of $CO_2$, and left for about 24 hours while stirred at 23 degrees C. to form nickel cores in ferritin. When nickel is filled in the cavity, a nickel core with a diameter of 7 nanometers is encapsulated in ferritin. A Ni compound formed in the cores is considered nickel oxide. Nickel oxide (NiO) has a lattice constant of 0.4195 nanometers in cubical crystal. Therefore, the number of atoms of Ni in the core with the diameter of 7 nanometers can be calculated to be about 2000. About 2000 nickel atoms are included in a nickel core with a diameter of 7 nanometers.

FIG. 2 shows a TEM image of a group of nickel cores. The scale in the figure indicates 100 nanometers. The black grain observed in a cage-like protein with a diameter of about 12 nanometers is a Ni core. The formation rate of the cores (the ratio of the number of ferritin molecules encapsulating Ni inside to the number of ferritin molecules having no Ni cores) was about 95 percent. It can be understood that the Ni cores have regularly even diameters of about 7 nanometers corresponding to the cavity size.

The concentration of nickel-encapsulating ferritin in the solution is controlled by determining the quantity by a light absorption method and diluting with water. Three types of nickel ferritin solutions with concentrations of 0.5 mg/ml, 0.15 mg/ml, and 0.05 mg/ml were prepared.

The relationship between the ferritin solution concentration and the Ni core density is shown in the logarithmic graph of FIG. 3. The relational expression of the relationship between the ferritin solution concentration [$C_{fer}$] and the Ni core density [$D_{Ni}$] obtained by power approximation is shown as the following equation 1.

$$[D_{Ni}] = (8 \times 10^{10}) \times [C_{fer}]^{2.8}$$ [Equation 1]

That is, it could be derived that the Ni core density [$D_{Ni}$] was in proportion to 2.8 power of the ferritin solution concentration [$C_{fer}$]. It was proved that the Ni core density could be controlled to $2.5 \times 10^{11}$, $2.8 \times 10^{10}$, and $2.6 \times 10^9$ (cm$^{-2}$) at the respective concentrations by the ferritin solution concentration.

In addition, as a method of controlling the density of nickel cores, a method in which a modified film is patterned will be described. A modified film which adsorbs ferritin, for example, aminopropyl trietoxysilane (APTES) is patterned at predetermined intervals on an amorphous silicon film and a ferritin solution adjusted in concentration is dripped onto the substrate, whereby ferritin can be selectively arranged on the modified film. APTES forms a film having a function for bonding an amino group (—NH$_2$) charged positively and ferritin charged negatively.

[Chemical Formula 1]

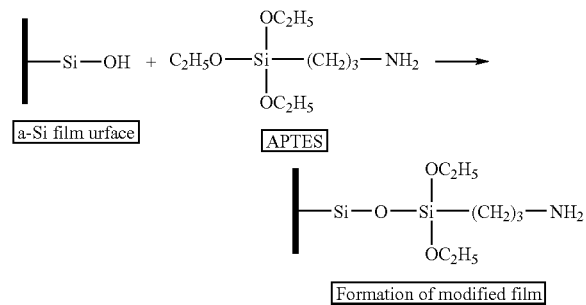

A nickel ferritin solution was dripped on an amorphous silicon film and then subjected to UV ozonation at 110 degrees C. for 40 minutes to remove the outer ferritin shell. Although crystallization of amorphous silicon is possible according to the method of the present invention even if the outer shell remains, protein as an impurity obstructs crystallization, so that it is preferable that the outer shell is removed.

An SEM image of the density of nickel cores after being subjected to UV ozonation is shown in FIG. 4. On the upper stage of FIG. 4 (a) through (c) distributions of nickel ferritin dripped on amorphous silicon before being subjected to UV ozonation are shown. On the other hand, on the upper stage of FIG. 4 (a') through (c') on the lower stage of FIG. 4 cores of nickel silicide after being subjected to UV ozonation are shown. To control the Ni core density, the Ni-ferritin solution concentration is changed to 0.5, 0.15, and 0.05 mg/ml by diluting with pure water. According to the change in concentration, the density of Ni cores changes. The density of nickel cores is calculated by counting the Ni cores in a range of 200×200 nanometers from a SEM image photograph. In the figure, (a) and (a') show a density of nickel cores of $2.5 \times 10^{11}$ (cm$^{-2}$), (b) and (b') show a density of nickel cores of $2.8 \times 10^{10}$ (cm$^{-2}$), and (c) and (c') show a density of nickel cores of $2.6 \times 10^9$ (cm$^{-2}$).

Observing the state of nickel silicide after being subjected to UV ozonation, distinct Ni cores are not observed from the SEM image, but patterns in circles of about 50 to 150 nanometers having comparatively uniform sizes are observed. It is understood that the size and density of the circular patterns become smaller according to a reduction in Ni core density. In greater detail, when the Ni cores have the highest density of $2.5 \times 10^{11}$ (cm$^{-2}$), twenty cores gather in a square of about 10 nanometers and form a circular Ni$_2$Si pattern with a diameter of about 100 nanometers. On the other hand, when the Ni cores have the lowest density of $2.6 \times 10^9$ (cm$^{-2}$), the smaller number of Ni cores gather and form a small Ni$_2$Si pattern having a diameter of 50 nanometers or less and longer intervals of 2 to 3 microns. When the density of Ni cores is $2.8 \times 10^{10}$ (cm$^{-2}$) that is intermediate, the intervals of the Ni$_2$Si pattern is about 500 nanometers. These results show that the first positions of nickel silicide can be controlled as cores of crystallization of an amorphous silicon film.

After UV ozonation, amorphous silicon having controlled crystal cores is heated to 550 degrees C. for 10 minutes and annealed for 25 hours in a N$_2$ atmosphere in an RTA furnace. Heating and continuous annealing grow the cores of NiSi$_2$ laterally.

FIG. 5 is a process flow view of a solid-phase growth method using Ni-encapsulating ferritin. This shows processes in a process flow of silicon crystallization before UV ozonation, after UV ozonation, and after annealing. In FIG. 5, (a) shows a state where nickel ferritin is dripped on amorphous silicon before the UV ozonation, (b) shows a state of cores of nickel silicide after being subjected to UV ozonation, and (c) shows a state of amorphous silicon crystallized after being annealed.

Hereinafter, processes of a solid-phase growth method using Ni-encapsulating ferritin will be described. First, the ferritin concentration is adjusted by diluting a synthesized Ni-ferritin solution with pure water and the solution is dripped on an a-Si film on a glass substrate and adsorbed for 10 minutes. The a-Si film is formed by deposition to a film thickness of 50 nanometers according to an LPCVD method by using a mixed gas of SiH$_4$/He (50%) (=200 sccm) and N2 (=150 sccm) under film forming conditions of a film forming gas pressure of 0.25 Torr and a film forming temperature of 520 degrees C.

Next, before ferritin adsorption, the a-Si film surface is subjected to UV/O$_3$ treatment at 110 degrees C. for 10 minutes for cleaning the film surface (removing organic contaminants) and maintaining hydrophilic property. After ferritin adsorption, an extra solution is removed with a centrifugal separator (at 9000G for 10 minutes) and the film is naturally dried.

Thereafter, for removing the outer protein shell of Ni-ferritin, UV/O$_3$ treatment (ultraviolet irradiation from a UV lamp and exposure to ozone generated from an ozone generator) is performed at 110 degrees C. for 40 minutes. By an RTA (Rapid Thermal Annealing) apparatus, the a-Si film on which Ni cores are arranged is rapidly raised in temperature to 550 degrees C. in 10 minutes in the atmosphere N$_2$, held at this temperature for 25 hours, and subjected to heat treatment, whereby an Si film of solid-phase grown is obtained.

FIG. 6 shows crystal grain mapping images according to an EBSD method (electron backscatter diffraction method) after annealing at the respective nickel core densities. A crystal grain in mapping is defined according to high-angle grain boundaries with an azimuth difference of 5 to 180 degrees between adjacent measurement points. Identical crystal grains are identified and indicated by gray scale.

In the sample [A] with the highest core density of $2.5 \times 10^{11}$ (cm$^{-2}$), the film entirety is indicated in black, and crystal grains of 3 micrometers or less are observed in part, however, it is seen that fine crystals occupy the majority in the entire region.

In the sample [B] with the core density of $2.8 \times 10^{10}$ (cm$^{-2}$), many crystal grains of 7 micrometers or less are observed in the fine crystal region indicated in black, and in comparison with the sample [A], it is considered that crystals grew with Si—Si long distance order.

Furthermore, in the sample [C] with a core density lowered to $2.6 \times 10^9$ (cm$^{-2}$), the fine crystal regions indicated in black are for the most part not observed, while crystal grains with comparatively uniform grain sizes of several micrometers are observed.

The mapping image of the sample [D] without cores observed as a comparative example is at a magnification of 3500 different from the above-described three samples. As a result of analysis, fine crystals are observed in the film entire region and crystal grains of about 200 to 500 nanometers are observed in part, so that it is understood that growth of crystal grains to the size of micrometers is not observed.

Thus, regarding crystal grain size, it was proved that the crystal grains with large sizes are grown according to the reduction in core density. That is, it is understood that the crystal grain size remarkably increases in inverse proportion to lowering of nickel core density. It is understood that in the sample without cores, crystal grains with sizes of micrometers are not observed and the observed crystals are fine crystals Si with sizes of several tens of nanometers.

FIG. 7 shows an IQ (Image Quality) value distribution according to an EBSD analysis. In FIG. 7, gray-scale images analyzed in a crystal grain map are distributed as IQ values by setting an amorphous phase as 0 and single crystalline silicon as 220 (this value is unique to the measurement device), and crystal grain images of the respective samples are indicated on a chart. When the IQ value is low, it can be judged as a region with low crystallinity or a boundary, and when the IQ value is high, it can be judged as a crystal region with high crystallinity and long-distance order.

As seen in the distribution graph of FIG. 7, the IQ values of the respective samples peak at (a): IQ=80, (b): IQ=110, (c): IQ=170, and (d): IQ=50. The IQ value peaks of the respective samples are (c)>(b)>(a)>(d), and in this order, the samples have the higher long-distance order.

INDUSTRIAL APPLICABILITY

The present invention is expected to be widely industrially utilized in thin-film transistors and memories, etc. Particularly, realization of a low-temperature polysilicon TFT and memory with higher electron mobility can be expected.

According to the present invention, a film with excellent quality can be fabricated by a very simple method and a low-temperature process.

Figure 1:
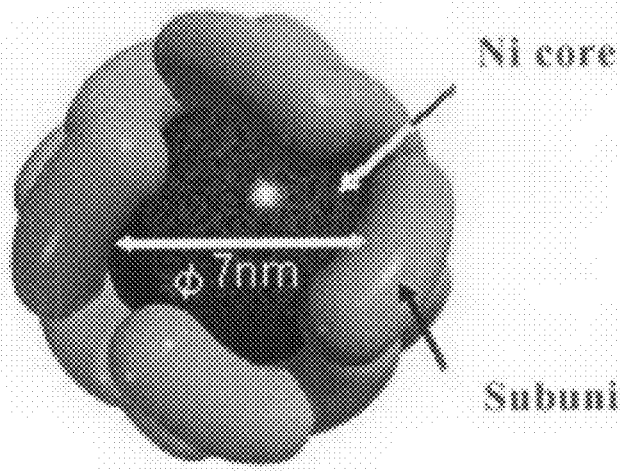
FIG. 1(a) is a schematic view of ferritin including a Ni core encapsulated inside.
FIG. 1(b) is an explanatory view of ferritin which ingests Ni ions into a cavity.
Figure 1:
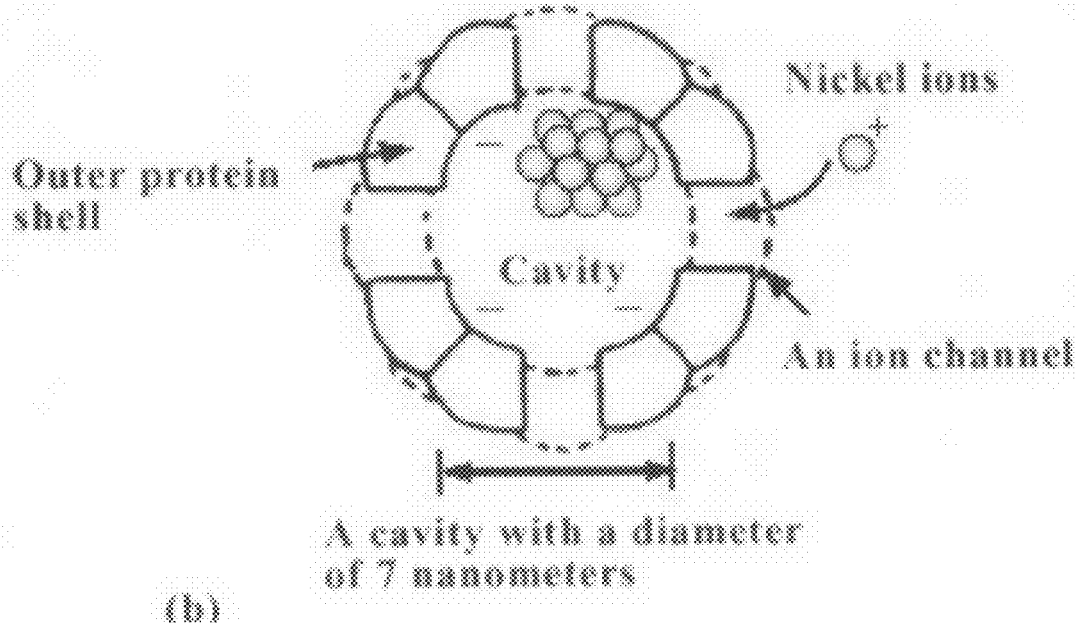
Figure 2:
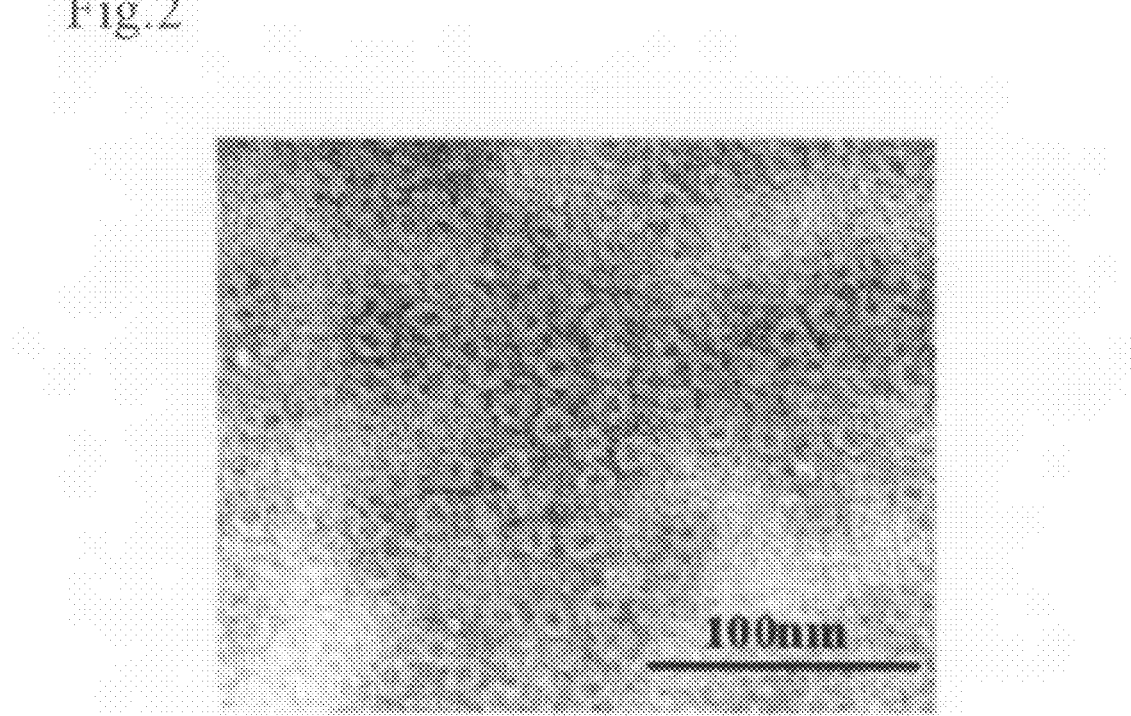
FIG. 2 is a TEM image of ferritin including nickel cores formed in cavities.
Figure 3:
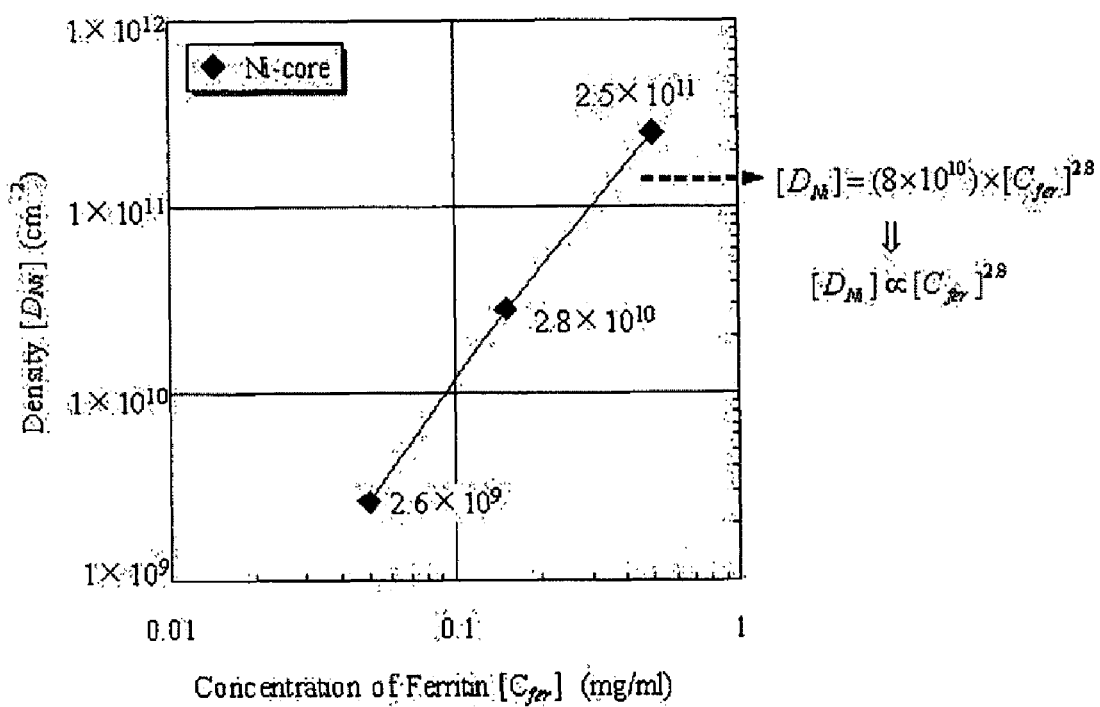
FIG. 3 is a correlation diagram of a ferritin concentration in a solution and nickel cores.
Figure 4:
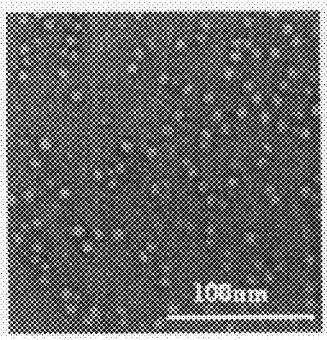
FIG. 4 shows cores of nickel silicide before and after UV ozonation.
Figure 4:
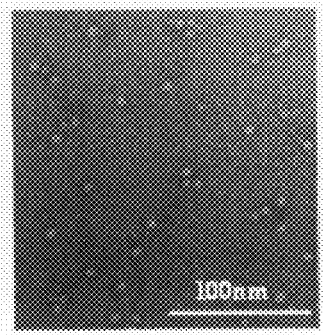
Figure 4:
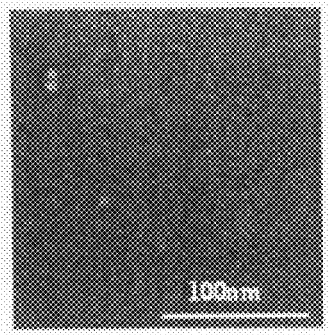
Figure 4:
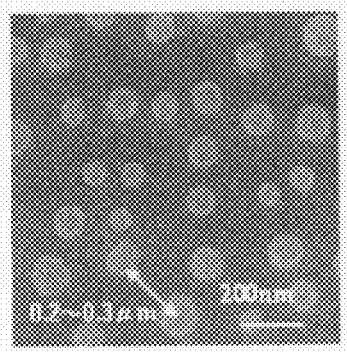
Figure 4:
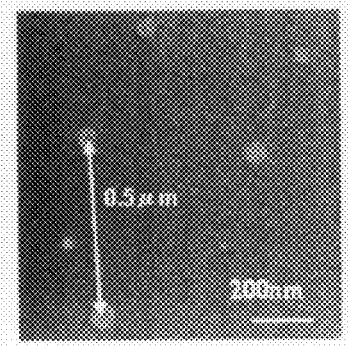
Figure 4:
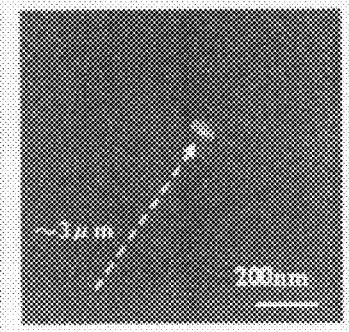
Figure 5:
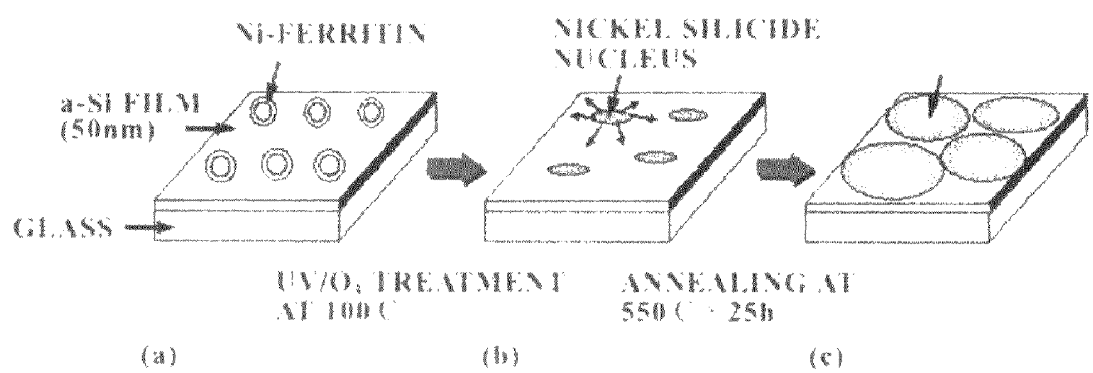
FIG. 5 is a process flow view of a solid-phase growth method using Ni-encapsulating ferritin, wherein (a) shows Ni-ferritin adsorbed to an a-Si film deposited on a glass substrate, (b) shows formation of nickel silicide cores by means of a protein removal by UV/O$_3$ at 110 degrees C., and (c) shows heat treatment and crystallization by RTS at 550 degrees C. in N$_2$ atmosphere.
Figure 6:
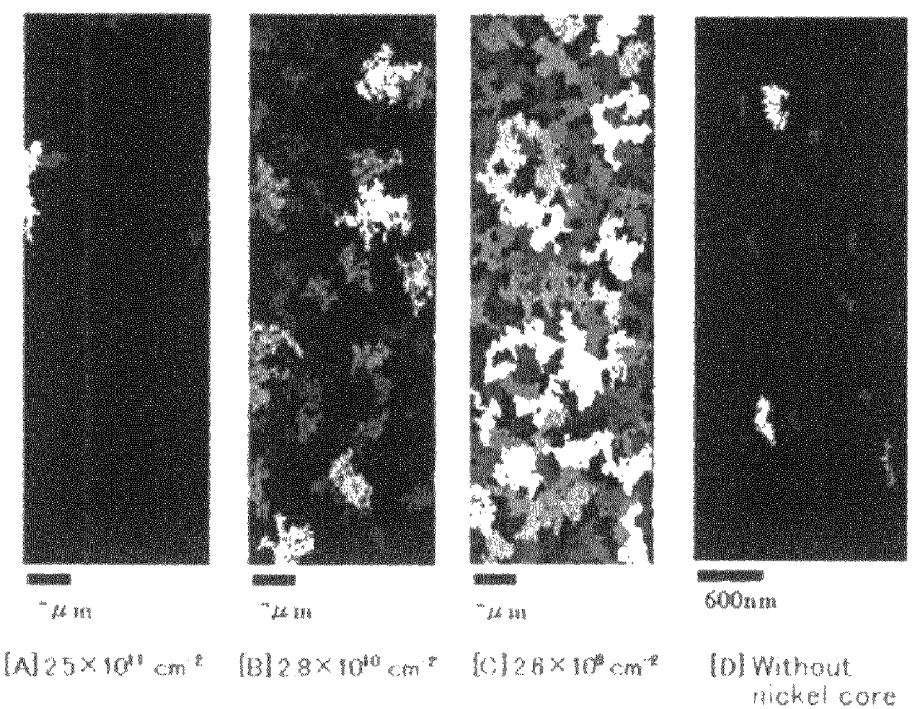
FIG. 6 shows crystal grain mapping images according to EBSD analysis.
Figure 7:
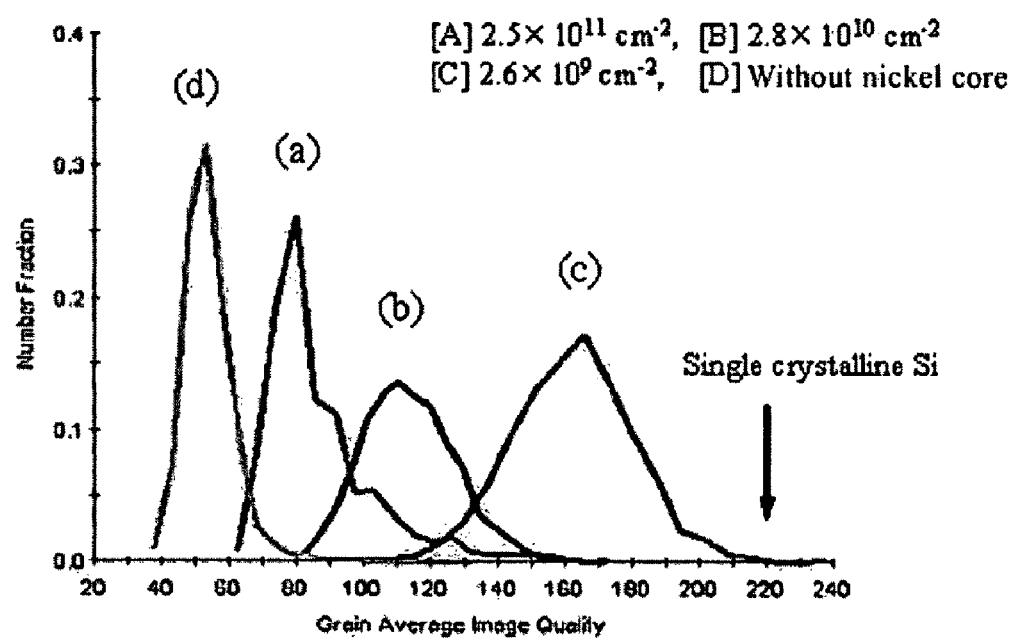
FIG. 7 shows IQ (Image Quality) value distribution according to EBSD analysis.

The invention claimed is:

1. A method of fabricating a thin-film transistor comprising the steps of:
   (1) depositing an amorphous semiconductor film;
   (2) arranging a metal encapsulated in protein on the amorphous semiconductor film; and
   (3) annealing the metal and the amorphous semiconductor film,
   wherein the amorphous semiconductor film is crystallized to form a channel portion of the thin-film transistor,
   wherein the protein is ferritin, and
   wherein the ferritin is ferritin in which iron as a metal encapsulated inside is substituted by nickel by means of chemical reaction.

2. A method of fabricating a thin-film transistor comprising the steps of:
   (1) depositing an amorphous semiconductor film;
   (2) arranging a metal encapsulated in protein on the amorphous semiconductor film; and
   (3) annealing the metal and the amorphous semiconductor film,
   wherein the amorphous semiconductor film is crystallized to form a channel portion of the thin-film transistor, and
   wherein the annealing temperature is 550 degrees C. or less.

3. A method of fabricating a thin-film transistor comprising the steps of:
   (1) depositing an amorphous film;
   (2) arranging a metal encapsulated in protein on the amorphous film; and
   (3) annealing the metal and the amorphous film,
   wherein the amorphous film is crystallized to form a channel portion of the thin-film transistor,
   wherein the protein is ferritin,
   wherein the metal includes nickel cores,
   wherein a supply amount and a distribution density of nickel cores are controlled by controlling a concentration of ferritin to be dripped on the amorphous film, and wherein the density of the nickel cores is set to $1.0 \times 10^{10}$ cm$^{-2}$ or less by adjusting the concentration of the ferritin.

4. A method of fabricating a thin-film transistor comprising the steps of:
(1) depositing an amorphous film;
(2) arranging a metal encapsulated in protein on the amorphous film; and
(3) annealing the metal and the amorphous film,
wherein the amorphous film is crystallized to form a channel portion of the thin-film transistor,
wherein the protein is ferritin,
wherein the metal includes nickel cores,
wherein a supply amount and a distribution density of nickel cores are controlled by controlling a concentration of ferritin to be dripped on the amorphous film, and
wherein in the control of distribution density of the nickel cores, a film for adsorbing ferritin is patterned in advance on the amorphous film at predetermined intervals or at positions corresponding to channel positions of the transistor, whereby ferritin is selectively arranged on the amorphous film.

5. The method of fabricating a thin-film transistor according to claim 3, wherein in the control of distribution density of the nickel cores, a film for adsorbing ferritin is patterned in advance on the amorphous film at predetermined intervals or at positions corresponding to channel positions of the transistor, whereby ferritin is selectively arranged on the amorphous semiconductor film.

* * * * *